United States Patent [19]

Onabe

[11] Patent Number: 4,675,708
[45] Date of Patent: Jun. 23, 1987

[54] SEMICONDUCTOR SUPERLATTICE STRUCTURE

[75] Inventor: Kentaro Onabe, Tokyo, Japan

[73] Assignee: NEC Corporation, Tokyo, Japan

[21] Appl. No.: 779,756

[22] Filed: Sep. 24, 1985

[30] Foreign Application Priority Data

Sep. 25, 1984 [JP] Japan .................... 59-200207

[51] Int. Cl.⁴ .................................. H01L 27/12
[52] U.S. Cl. ................................ 357/4; 357/16
[58] Field of Search .................. 357/4 SL, 4, 16

[56] References Cited

U.S. PATENT DOCUMENTS 4,261,771  4/1981  Dingle ........................... 357/4 SL

OTHER PUBLICATIONS

III-Binary and Quaternary Systems, pp. 42–45.
Molecular Beam Epitaxial Growth of InGaAlP on (100) GaAs, Asahi et al, J. Appl. Phys. 53(7), Jul 1982, pp. 4928–4931.
Electronics Letters, Mar. 3, 1983, vol. 19, No. 5, pp. 163–165 "0.66 μm Room–Temperature Operation of InGaAlP DH Laser Diodes Grown by MBE".
"Modulated Semiconductor ... Structure$^a$),$^b$)", Madhukar, J. Vac. Sci. Technol., 20(2), Feb. 1982, pp. 149–161.
"Electronic Structure ... Superlattices$^a$)", Kim et al, J. Vac. Sci. Technol., 21(2), Jul./Aug. 1982, pp. 528–530.
"Band Structure ... Superlattices", Schulman et al, Physical Review Letters, vol. 39, No. 26, Dec. 26, 1977, pp. 1680–1683.

Primary Examiner—Martin H. Edlow
Attorney, Agent, or Firm—Sughrue, Mion, Zinn Macpeak & Seas

[57] ABSTRACT

A light emitting diode, semiconductor laser or similar light emitting element, having an emission wavelength is 560 nanometers or less, that is implemented with only III-V compound semiconductors. The active layer of the light emitting element uses a semiconductor superlattice structure generated by periodically and repeatedly laminating a multi layer structure of different semiconductors. The structure comprises layers of AlP, GaP and InP, each layer being one of ten atomic layers thick.

13 Claims, 2 Drawing Figures

SEMICONDUCTOR SUPERLATTICE STRUCTURE

BACKGROUND OF THE INVENTION

The present invention relates to a semiconductor superlattice structure which is applicable to a light emitting device.

A light emitting device using a III-V compound semiconductor has been developed and has achieved emissions in the visible (red) to infrared wavelength range. The prerequisite for a light emitting material is that the energy gap Eg specific to the material is of a direct transition type. Where such a material is used to constitute an active (emission) layer of a light emitting diode, semiconductor laser or like device, there can be generated emissions with a wavelength $\lambda_g$ (nanometer)=1240/Eg (electron-volt) as is determined by the energy gap Eg. Usually, an active layer is provided by depositing a compound semiconductor, having an energy gap Eg which is associated with a desired emission wavelength $\lambda_g$, to a thickness of several hundred angstroms or above. In the case where an energy gap associated with a desired wavelength cannot be implemented with GaAs or like compound semiconductor made up of two different elements, i.e., binary compound semiconductor, it is permissible to use a suitable mixed crystal consisting of three or four different elements and having a uniform composition, i.e. a ternary mixed crystal compound semiconductor such as $Al_xGa_{1-x}As$ or a quarternary mixed crystal compound semiconductor such as $In_{1-x}Ga_xAs_yP_{1-y}$.

A light emitting device of the kind providing an active layer as described above will hereinafter be referred to as an ordinary type light emitting device. In this case, the value which can be selected as the shortest emission wavelength is dependent on the largest one of direct transition type energy gaps, or direct energy gaps, Eg. So far as III-V compound semiconductors are concerned, the largest direct energy gap Eg is 2.3 electron-volts which is the energy gap of $Al_{0.45}In_{0.55}P$, a ternary mixed crystal compound semiconductor; a wavelength $\lambda_g$ which is associated with such an energy gap is nearly equal to 540 nanometers (H. C. Casey Jr. and M. B. Panish "Heterostructure Lasers; part B", Academic Press, New York, 1978, pp. 43-45). In practice, high quality layers of compound semiconductor crystals are unattainable unless they are deposited with their lattice constants substantially matched on a suitable single crystal substrate and, in this regard, $Al_xGa_yIn_{1-x-y}P$ of the type being deposited with matched lattice constants on a GaAs single crystal substrate is presently accepted as a material having the shortest emission wavelength which can be implemented with a III-V compound semiconductor. Based on such an idea, efforts have been made to shorten the emission wavelength of light emitting elements (H. Asahi, Y. Kawamura and H. Nagai, J. Appl. Phys. 53 (1982), pp. 4928-4391; Y. Kawamura, H. Asahi, H. Nagai and T. Ikegami, Electron. Lett. 19 (5) (1983) pp. 163-165). In this case, the largest value of direct energy gaps is 2.2 electron-volts and the shortest emission wavelength is substantially 560 nanometers (green).

Meanwhile, from an application standpoint, a light emitting element lying in a shorter wavelength range, i.e., blue-green to green range, is desired. However, meeting such a desire by use of a III-V compound is generally considered difficult for the previously stated reason. A light emitting material which emits in the blue-green to green range may be implemented by ZnSe or like II-VI compound semiconductor. Nevertheless, such has also been impracticable because many of constituent elements of a II-VI compound semiconductor, compared to those of a III-V compound semiconductor, have high vapor pressures so that a reduction of lattice defects which are introduced during the course of crystal growth is far more difficult in a II-VI compound semiconductor than in a III-V compound semiconductor. In this regard, shortening the emission wavelength using a III-V compound semiconductor whose lattice defects are relatively easy to control would be an invaluable contribution to the art.

SUMMARY OF THE INVENTION

It is therefore an object of the present invention to provide a semiconductor structure which eases the limitations on the shortest emission wavelength in relation to the use of the previously discussed III-V compound semiconductor as an active layer of a light-emitting element and, thereby, makes a visible light-emitting element having an emission wavelength $\lambda_g$ shorter than 560 nanometers practicable by use of a III-V compound semiconductor.

In accordance with the present invention, the above object is achieved by using, as an active layer of a semiconductor light emitting element, a semiconductor superlattice structure in which a laminated layer of III-V binary compound semiconductors AlP, GaP and InP, each being desposited to a predetermined thickness of 1 to 10 atomic layers, constitutes one period. It will be noted that a "superlattice structure" implies a structure provided by periodically and repeatedly laminating a multi-layer structure of different semiconductors.

DETAILED DESCRIPTION OF THE PREFERRED EMBODIMENT

Figure 1:
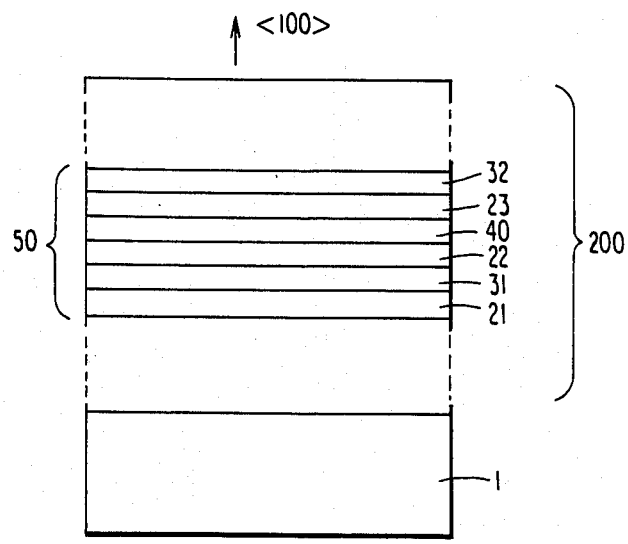
FIG. 1 is a section of a superlattice structure embodying the present invention.

The present invention is derived from the fact that, even if mixed crystal compound semiconductors which constitute the respective layers of a semiconductor superlattice structure or a binary compound has an indirect energy gap or even if a mixed crystal compound semiconductor provided by replacing a superlattice structure with a mixed crystal, which corresponds to an average composition of one period, has an indirect energy gap, the energy gap of the semiconductor superlattice structure is capable of directly turning into a direct transition type due to the periodic structure (A. Madhukar, J. Vac. Sci. Technol. 20 (2) (1982), pp. 149-161). Such an occurrence has been theoretically proved using a Gap-AlP superlattice (J. Y. Kim and A. Madhukar, J. Vac. Sci. Technol. 21 (2) (1982), pp. 528-530) (GaP, AlP and $Ga_{1-x}Al_xP$ commonly have an indirect energy gap), or a GaAs-AlAs superlattice (J. N. Schulman and T. C. McGill, Phys. Rev. Lett. 39 (26) (1977), pp. 1680-1683) (both of AlAs and $Al_xGa_{1-x}As$ (x>0.4) have indirect energy gaps).

A uniform $Al_xGa_yIn_{1-x-y}P$ mixed crystal, if its composition is equal in lattice constants to GaAs, has a direct energy gap, that is, both the lower end of a conduction band and the upper end of a valence band of electronic energy are positioned at the $\Gamma$ point ($|k=0$) of the wave number vector space (Brillouin zone), so longs as $x \leq 0.21$. However, when $x > 0.21$, the lower end of the conduction band shifts to the X point ($|k=2\pi/a (1, 0, 0)$) so that the energy gap of the mixed crystal turns into an indirect transition type. Quantum mechanics teaches that the crystal with an indirect energy gap attains only a significantly low transition probability which causes emissions and, therefore, is unsuitable as a light emitting material. Meanwhile, where a periodic structure whose period is an integral multiple of the lattice period is introduced into a crystal structure, it will be seen through the preliminary principle of crystal electronics that the wave number vector space is reduced according to the period. For example, if the period is N times the lattice period (expressed as "having a superperiod N"), the wave number vector along the periodic structure is reduced to 1/N. Especially, where the periodic structure extends in the $<100>$ direction of a crystal and the superperiod N is an even number, the energy at the X point shifts to the $\Gamma$ point due to the so-called band-folding effect. This implies nothing but the fact that the energy gap is transformed from an indirect transition type into a direct transition type without changing its gap width.

Hence, if provided with a superperiod structure in the $<100>$ direction, even $Al_xGA_yIn_{1-x-y}P$ could attain a direct energy gap in an energy region ($Eg > 2.2$ electron-volts) wherein it is expected to have an indirect energy gap in a uniform mixed crystal phase. Actually, however, forming a distinct periodic structure, while leaving the mixed-crystal materials of the respective layers as they are, generally becomes more difficult as each of the layers becomes as thin as the order of several atomic layers and, hence, it is advantageous to use a laminate of unit structures each being made up of AlP, GaP and InP. Such will define a distinct interface between the nearby layers. It is also required that each of the layers constituting the unit structure be thin enough to prevent the characteristic of the binary compound from becoming significant, that is, the should be one to ten atomic layers which is sufficiently smaller than the de Broglie wavelength of electrons (about 100 angstroms). In such a situation, electrons become sensitive to an average potential of the whole superlattice instead of potentials specific to the respective binary compounds, the effect of a superlattice developing in this manner.

Referring to FIG. 1 of the drawings, a superlattice structure in accordance with the present invention is shown and generally designated by the reference numeral 200. The superlattice structure 200 is provided on a GaAs substrate 1 and is made up of at least several tens to several hundreds of unit structures 50 which are sequentially laminated in the $<100>$ direction of the GaAs substrate 1. Each of the unit structures 50 defines one period and comprises an InP single atomic layer 21, an AlP single atomic layer 31, an InP single atomic layer 22, a GaP single atomic layer 40, an InP single atomic layer 23, and an AlP single atomic layer 32. Since each of these layers in the unit structure 50 is sufficiently thin, distortions due to mismatching of lattice constants within the superlattice are not so significant as to introduce crystal lattice defects. Concerning an average composition, the superlattice structure corresponds to $Al_{0.33}Ga_{0.17}In_{0.5}P$. Although a mixed crystal having such a composition usually has an indirect energy gap, in accordance with the present invention, it attains a direct energy gap, $Eg = 2.35$ electron-volts, due to the use of a superlattice structure.

The above-described order of laminated semiconductor layers which constitute a unit structure is not restrictive. Specifically, while the order in the illustrative embodiment is InP-AlP-InP-Gap-InP-AlP, it may alternatively be InP-InP-InP-AlP-AlP-GaP or InP-InP-GaP-InP-AlP-AlP. In any of the alternative cases, where the conjugate layers comprise the same compound such as the InP layers or AlP layers, the sum of their thicknesses should preferably be maintained at ten atomic layers or less. Further, each of the layers in the unit structure may be selected within the range of one to ten atomic layers, instead of a single atomic layer shown and described. Since the energy gap of a superlattice structure is substantially determined by an average composition, it is possible to attain any desired bandgap by controlling the thickness of each layer. Whatever order may be selected for the layers in the unit structure, the indirect-to-direct energy gap transformation effect is utilized.

Figure 2:
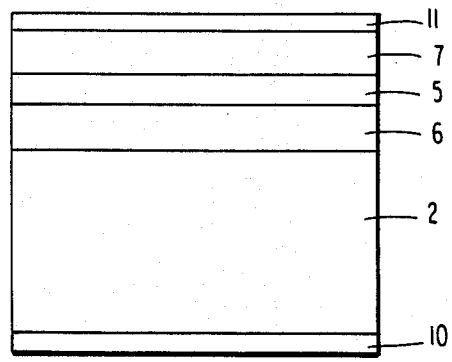
FIG. 2 is a section of a semiconductor laser to which the superlattice structure of the present invention is applied.

Referring to FIG. 2, a semiconductor laser to which the superlattice structure of the present invention is applied is shown. The semiconductor laser comprises an n-GaAs substrate 2, and a cladding layer 6, an active layer 5 having a superlattice structure and a cladding layer 7 which are sequentially provided on the substrate 2 by molecular beam epitaxy. An n-type electrode 10 is provided on the substrate 10 and a p-type electrode 11 on the cladding layer 7. The active layer 5 having the superlattice shown in FIG. 1 has a total thickness of about 0.1 micron and an average composition which corresponds to $Al_{0.33}Ga_{0.17}In_{0.5}P$. The cladding layer 6 and 7 respectively comprise n-$Al_{0.5}In_{0.5}P$ and p-$Al_{0.5}In_{0.5}P$ and each have a greater effective energy gap than the superlattice structure. The cladding layers 6 and 7 constitute a double-heterostructure together with the active layer 5. In this structure, injected electrons and light can be effectively confined in the active layer 5.

In summary, it will be seen that in accordance with the present invention a light emitting diode, semiconductor laser or like light emitting element whose emission wavelength is as short as 560 nanometers or less can be implemented only with a III-V compound semiconductor by using, as an active layer of the light emitting element, a semiconductor superlattice structure which is made up of an AlP layer, a GaP layer and an InP layer each being one to ten atomic layers thick.

What is claimed is:

1. A semiconductor superlattice structure in which semiconductor materials which are different from each other are periodically deposited one upon another, characterized in that a unit structure which defines one period consists of layers of AlP, GaP and InP each having a predetermined thickness of the order of one to ten atomic layers.

2. The structure as claimed in claim 1 wherein said structure has a direct energy gap.

3. The structure as claimed in claim 2 wherein said structure has no crystal lattice defects.

4. A light emitting element capable of emitting light at a wavelength less than 560 nanometers and having an active layer implemented only with III-V compound semiconductor material, said active layer comprising a superlattice structure which includes at least a GaP layer, an AlP layer and one InP layer, each such layer being 1 to 10 atoms thick.

5. A light emitting element as claimed in claim 4 wherein said active layer has a direct energy gap in an energy region, Eg, where Eg is greater than 2.2 electron volts.

6. A light emitting element as claimed in claim 4 wherein said active layer has no crystal lattice defects.

7. A multi-layer light emitting element comprising:
first and second electrodes;
a semiconductor substrate of n-GaAs material having on one surface thereof said first electrode;
a first cladding layer disposed on the other surface of said substrate;
a second cladding layer and
an active layer having a substrate structure; and disposed between said first cladding layer and said second cladding layer, wherein
said active layer comprises at least one each of an AlP layer, a GaP layer and an InP layer, each such layer being 1 to 10 atom layers thick.

8. The light emitting element as claimed in claim 7 wherein each of said first and second cladding layers has an effective energy gap greater than that of the active layer.

9. The light emitting element as claimed in claim 7 wherein said cladding layers and said active layer constitutes a double-heterostructure.

10. The light emitting element as claimed in claim 7 wherein said active layer comprises at least two unit structures, each said unit structures comprising at least one each of an AlP layer, a GaP layer and an InP layer and all said units being laminated together in the <100> direction of said semiconductor substrate.

11. The light emitting element as claimed in claim 7 wherein the thickness of each layer on each unit structure is within the range of 1 to 10 atoms.

12. The light emitting element as claimed in claim 7 wherein said active layer has a direct energy gap.

13. The light emitting element as claimed in claim 7 wherein said active element has no crystal lattice defects.

* * * * *